United States Patent [19]
Tazawa et al.

[11] Patent Number: 5,394,010
[45] Date of Patent: Feb. 28, 1995

[54] SEMICONDUCTOR ASSEMBLY HAVING LAMINATED SEMICONDUCTOR DEVICES

[75] Inventors: Hiroshi Tazawa, Tokyo; Chiaki Takubo; Yoshiharu Tsuboi, both of Yokohama; Mamoru Sasaki, Tokyo, all of Japan

[73] Assignee: Kabushiki Kaisha Toshiba, Kawasaki, Japan

[21] Appl. No.: 849,630

[22] Filed: Mar. 12, 1992

[30] Foreign Application Priority Data

Mar. 13, 1991 [JP] Japan .................... 3-048418

[51] Int. Cl.⁶ ............... H01L 23/02; H01L 23/12
[52] U.S. Cl. ................... 257/686; 257/685; 257/696; 257/706
[58] Field of Search ............ 357/75; 257/777, 778, 257/685, 686, 693, 694, 695, 696, 697, 706, 707, 720, 722

[56] References Cited

U.S. PATENT DOCUMENTS 4,873,615 10/1989 Grabbe ........................... 257/696
4,956,694  9/1990 Eide ............................... 257/686

FOREIGN PATENT DOCUMENTS

| | | | |
|---|---|---|---|
| 0158956 | 9/1983 | Japan | 357/75 |
| 0138945 | 7/1985 | Japan | 357/81 |
| 0240153 | 11/1985 | Japan | 357/75 |
| 0023136 | 1/1987 | Japan | 357/75 |
| 63-182845 | 7/1988 | Japan | 257/686 |
| 2-32547 | 2/1990 | Japan . | |
| 2-156654 | 6/1990 | Japan | 257/686 |
| 2-177466 | 7/1990 | Japan . | |
| 2-198148 | 8/1990 | Japan . | |
| 0271655 | 11/1990 | Japan | 357/75 |
| 3-32050 | 2/1991 | Japan . | |

Primary Examiner—Andrew J. James
Assistant Examiner—S. V. Clark
Attorney, Agent, or Firm—Finnegan, Henderson, Farabow, Garrett & Dunner

[57] ABSTRACT

A semiconductor assembly comprises first and second containers which contain respective semiconductor chips and are stacked one over another. First and second external leads extending from the insides of the respective containers to outside thereof are bent so as to be connected to each other. The first and the second containers may be provided at corresponding positions with a recess and a projection to be engaged each other for positional alignment. There may be provided first and second heat radiating plates extending from the insides of the respective containers to outside thereof are bent so as to be connected to each other.

13 Claims, 7 Drawing Sheets

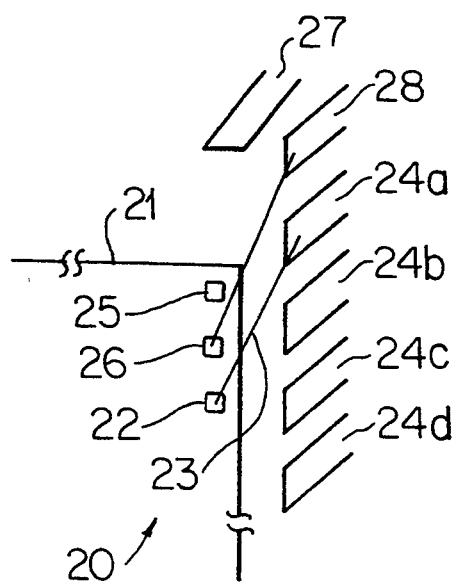
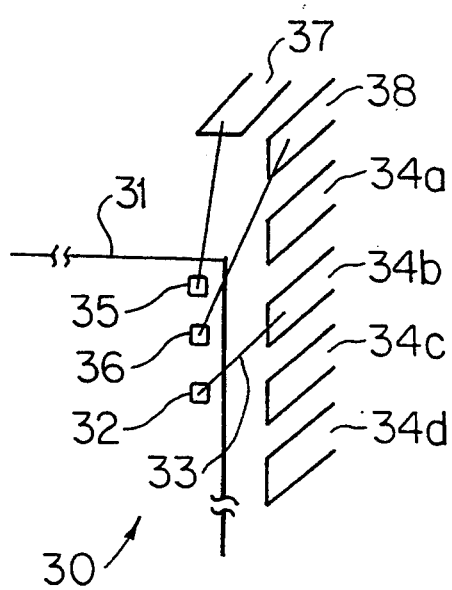
FIG. 4    FIG. 5
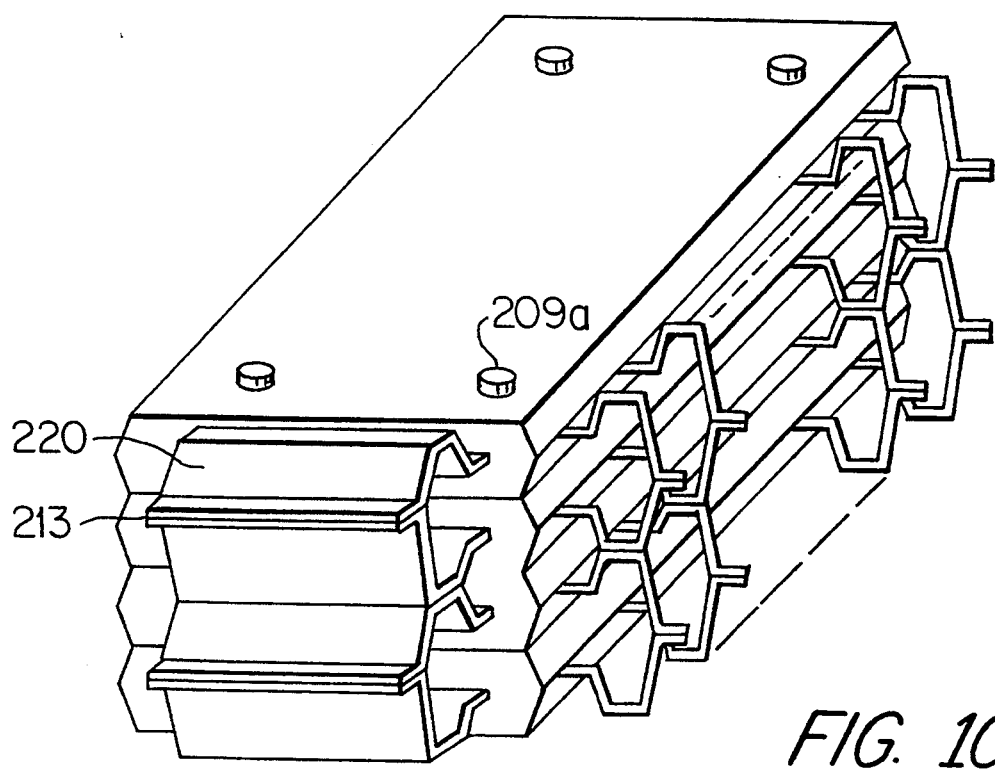
FIG. 10

SEMICONDUCTOR ASSEMBLY HAVING LAMINATED SEMICONDUCTOR DEVICES

BACKGROUND OF THE INVENTION

1. Field of the Invention

The present invention relates to semiconductor assemblies, and more particularly, to a semiconductor assembly having a laminated layer structure of a plurality of semiconductor devices.

2. Description of the Related Art

In semiconductor integrated-circuit devices, the degree of integration of the circuit has been increasing, and the number of pads for supplying input/output signals and a power supply voltage becomes very great while high operational speed required.

In electronic apparatus, particularly, in personal computers and large-scale computers, the mounting area of such semiconductor devices has been increasing. This increased mounting area has been a problem in the miniaturization of the apparatus.

For the purpose of avoiding the above problem, such measures have been taken as to increase the integration degree in which elements are arranged within a chip, and after packaging the chips, mounting the packages on a printed circuit board at a high density.

Conventionally, these packages of chips, such as surface mounting type semiconductor devices, are arranged on the surface of a printed circuit board out and the leads of the devices are connected to signal wiring lines on the printed circuit board.

Such a conventional mounting technique, however, has such a problem that, since the surface mounting type semiconductor devices are mounted on the surface plane in parallel or in a matrix form, it is impossible to remarkably reduce the mounting area for the devices.

SUMMARY OF THE INVENTION

In view of the above circumstances, it is an object of the present invention to provide a semiconductor assembly which can provide a high mounting density and a remarkably reduced mounting area.

To achieve the above object, the present invention provides a semiconductor assembly in which first and second containers containing respective semiconductor chips are stacked one over the other and first and second external leads extending from the insides of the respective containers to are bent as extended to surfaces of the second and first containers to be connected to each other.

With such an arrangement, terminals of the semiconductor chips can be electrically connected only by stacking the semiconductor chips, and thus connection for supplying signals can be easily realized at the time of mounting.

When this arrangement is employed for a memory, there can be obtained a large-capacity memory without increasing the mounting area.

Further, according to the present invention, the same mounting steps as conventionally employed can be use only by changing the bending shade of leads.

In another aspect of the present invention, first and second containers are provided at corresponding positions with a recess and a projection so that, when the first and second containers are stacked one over the other, the recess and projection are engaged to each other for positional alignment. Since the recess and projection are mutually engaged for positional alignment, easy positioning can be realized.

In still another aspect of the present invention, first and second containers containing respective semiconductors are mutually stacked, and first and second heat radiating plates extending from the insides of the respective containers are bent so as to extend to the surface levels of the second and first containers where they are connected to each other.

With this arrangement of the heat radiating plates, mounting of devices can be easily made and heat dissipation can be remarkably improved.

In further aspect of the present invention, the adjacent external leads have respective wide interconnection portions where the external leads are connected to each other. With this arrangement, reliable and stable interconnection can be realized.

BRIEF DESCRIPTION OF THE DRAWINGS

In the accompanying drawings:

FIG. 4 is an enlarged view illustrating a part of a semiconductor device to be used in the embodiment;

FIG. 5 is an enlarged view of a part of a semiconductor device to be used in the embodiment;

FIG. 10 is a perspective view of the semiconductor assembly of the third embodiment.

DETAILED DESCRIPTION OF THE EMBODIMENTS

Embodiments of the present invention will be explained in detail with reference to the accompanying drawings.

EMBODIMENT 1

Figure 1:
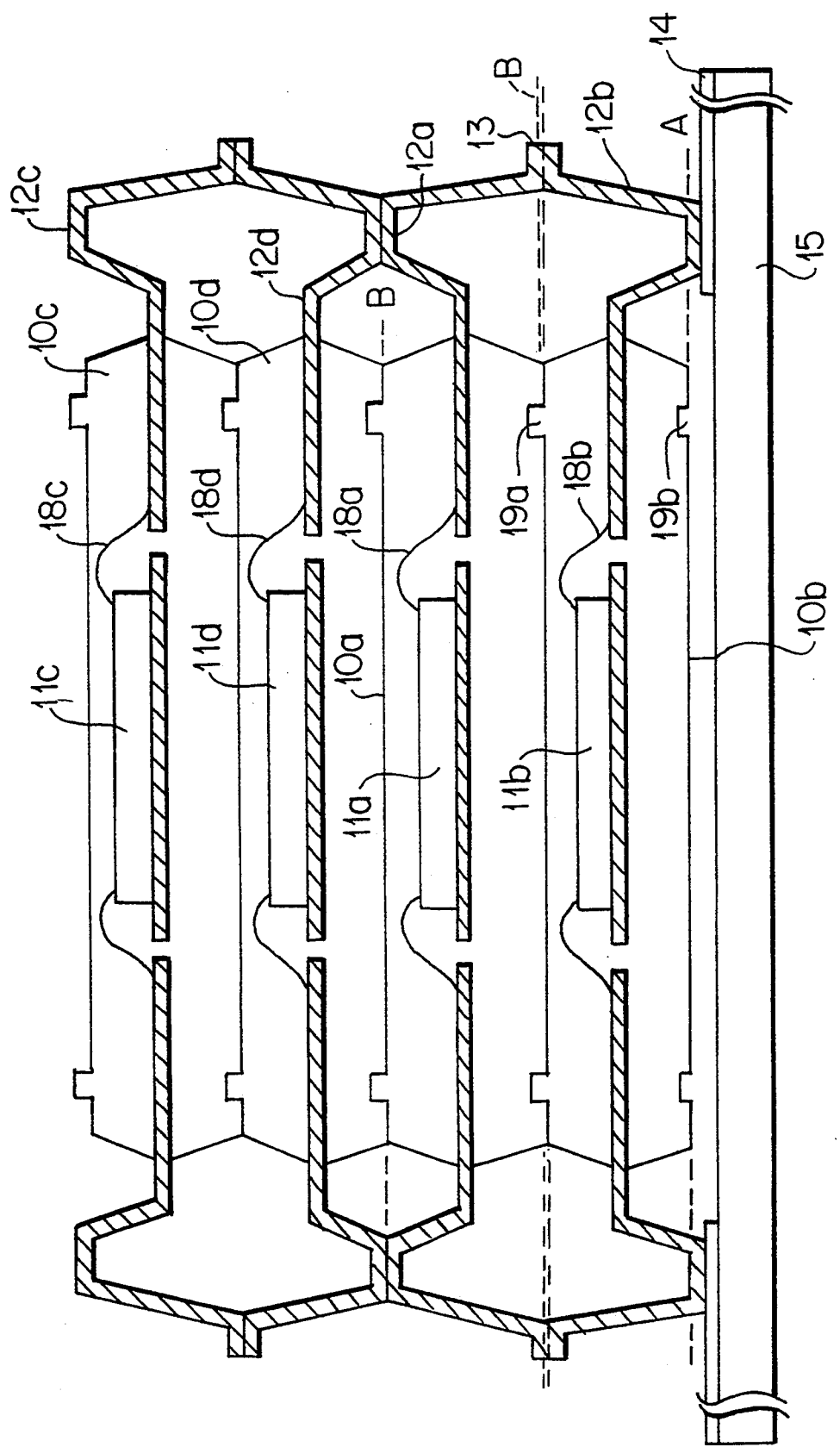
FIG. 1 is a cross-sectional view of a semiconductor assembly in accordance with a first embodiment of the present invention.
Figure 2:
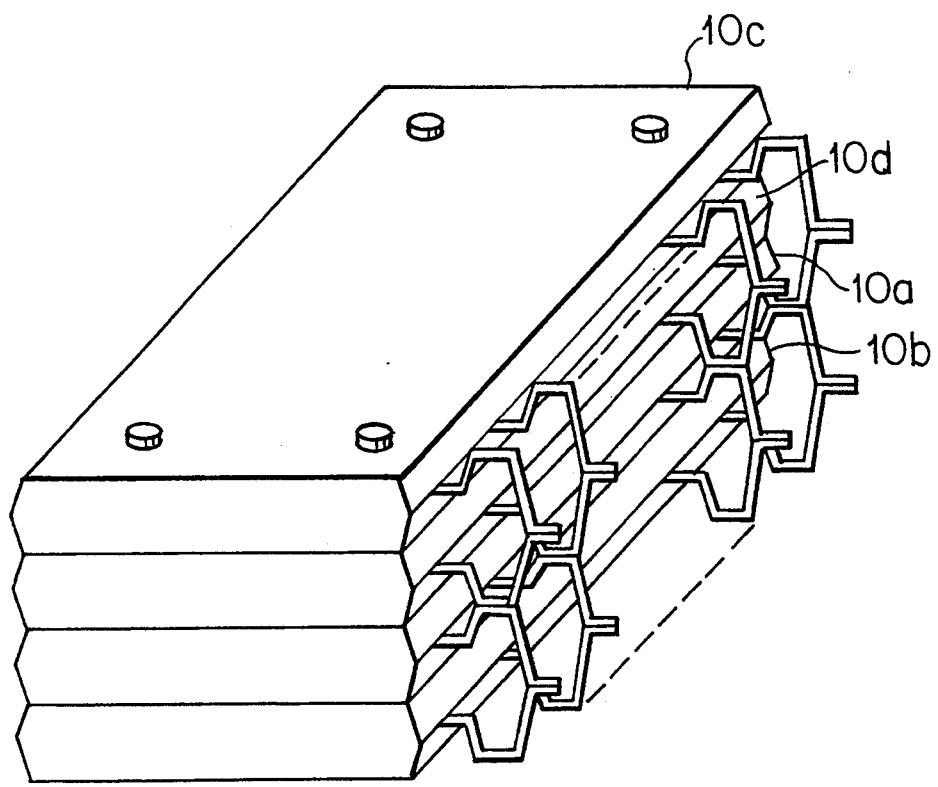
FIG. 2 is a perspective view of the first embodiment.

Referring to FIGS. 1 and 2, the semiconductor assembly comprises four semiconductor devices having containers stacked one over another. A first container 10a containing a first semiconductor chip 11a is stacked on a second container 10b containing a second semiconductor chip 11b. First and second external leads 12a and 12b extend from the insides of the containers 10a and 10b to the outside thereof and are bent respectively to the levels of the top and bottom surfaces of the first and second containers and then connected with each other in surface contact relationship to form a pair of interconnection portion 13. The interconnection portion 13 is then connected a wiring pattern 14 formed on a printed circuit board 15.

The first and second containers are provided at their corresponding positions with a recess 19a and a projection 19b for positional alignment which can fit into associated projection and recess of other containers.

In more detail, the first external lead 12a is extended once up to the upper surface level of the first container 10a, extended in the upper surface level of the container 10a by a predetermined length and then extended down to the lower surface level of the first container 10a.

On the other hand, the second external lead 12b is extended once down to the lower surface level of the second container 10b, extended in the lower surface level of the container 10b by a predetermined length and then extended up to the upper surface level of the second container 10b, where it is connected to the first external lead 12a in a surface contact relationship through a soldering layer.

In the same manner, third and fourth containers 10c and 10d are stacked on the stacked containers 10a and 10b, thus forming a 4-layer structure.

More specifically, the third container 10c containing a third semiconductor chip 11c is stacked on the fourth container 10d containing a fourth semiconductor chip 11d. Third and fourth external leads 12c and 12d extend from the insides of the containers 10c and 10d and are bent respectively to the top and bottom surface levels of the third and fourth containers and then connected with each other in surface contact relationship to form another interconnection portion 13. The fourth external lead 12d is extended once down to the lower surface level of the fourth container 10d, where the fourth external lead 12d is contacted with the first external lead 12a, that is, the fourth external lead 12d is connected through the first and second external leads 12a and 12b to the wiring pattern 14 of the printed circuit board 15. The third and fourth containers are provided at their corresponding positions with a recess 19c and a projection 19d for positional alignment which can fit into associated projection and recess of other containers.

The third external lead 12c is extended once up to the upper surface level of the third container 10c, extended in the upper surface level of the third container 10c by a predetermined length and then extended down to the lower surface level of the third container 10c.

On the other hand, the fourth external lead 12d is extended once down to the lower surface level of the fourth container 10d, extended in the lower surface level of the container 10d by the predetermined length and then extended up to the upper surface of the fourth container 10d, where it is connected to the third external lead 12c in a surface contact relationship through a soldering layer.

Figure 3A:
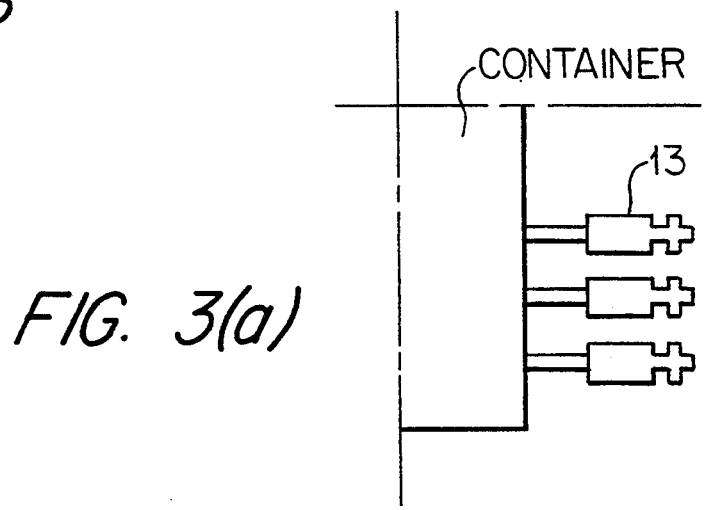
FIG. 3(a) is an enlarged view illustrating a part of the semiconductor device of the first embodiment.
Figure 3B:
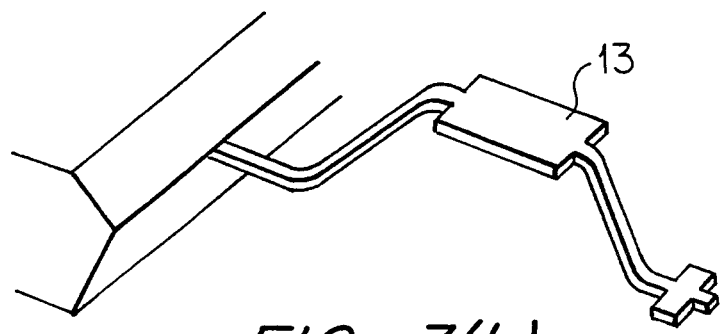
FIG. 3(b) is an enlarged perspective view illustrating a part of the semiconductor device.

Referring to FIGS. 3(a) and 3(b), each external lead has the interconnection portion 13 of a wide zone connected to one of external leads of another semiconductor device.

Shown in FIGS. 4 and 5 are parts of first and second ones of the aforementioned semiconductor devices. In the drawings, reference numerals 20 and 30 correspond to the first and second semiconductor devices, and semiconductor chips 21 and 31 correspond to the semiconductor chips 11a and 11b. These semiconductor chips are connected to each other by means of bonding wires connected between their electrode pads and leads.

Interconnection between the leads is carried out by previously printing a soldering layer to parts of the leads to be mutually connected, by stacking these leads and then by applying heat to the stacked parts of the leads. By applying heat to the leads of uppermost one of that stacked packages, all corresponding leads are heated so as to melt the soldering thereat, whereby the lead interconnection can be realized in the single heat application.

Figure 6:
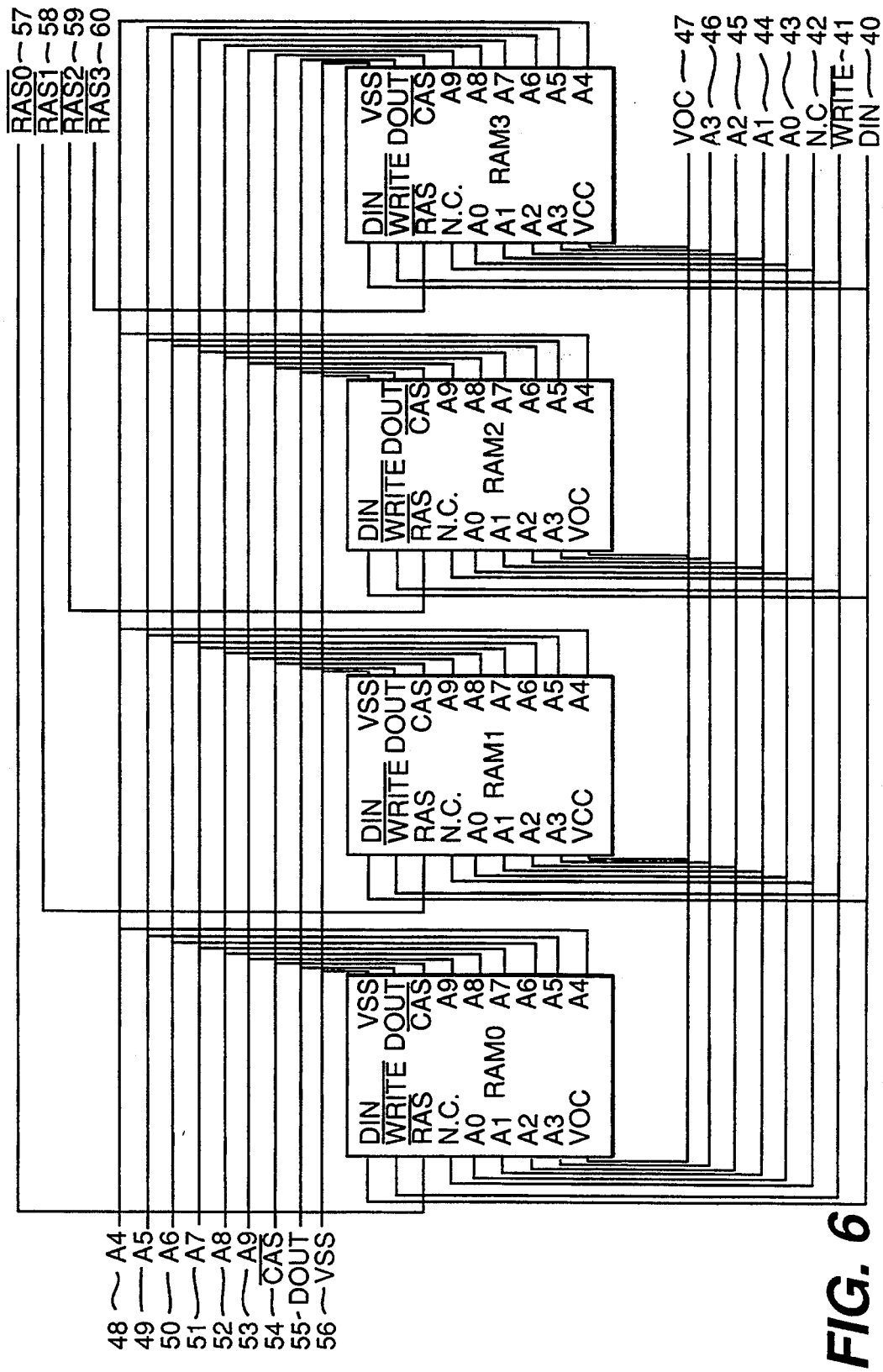
FIG. 6 shows a circuit diagram of a semiconductor assembly.

FIG. 6 illustrates a wiring state of terminals of memory chips. RAM 0 to RAM 3 of IM bite memory capacity have a CAS terminal 54, a data input terminal DN 40, a data output terminal Dout 55, a WRITE terminal 41, address terminals A0 to A9, 43 to 46, and 48 to 53, power supply terminals Vss 56 and Vcc 47. These terminals are used as common terminals to the RAMs.

Storing of data into the memory chips (data input) and reading out of data out of the memory chip (data output) are carried out on the basis of addresses set within the chip. Writing operation of a data into an address requires an address signal for designating the address, a write enable signal for enabling the writing operation and a data signal containing the data to be stored.

In writing a data, a signal for designating a data address is applied to associated one of the address terminals 43 to 46 and 48 to 53, a data signal to be written is applied to the data input terminal 40, a low signal is applied to the write enable terminal 41, and associated signals are applied to the RAS terminals 57 to 60 and the CAS terminal 54. Thus, the data is written in the designated address of the respective chip.

In reading out a data from the chips, a signal for designating an address for the data is applied to associated one of the address terminals 43 to 46 and 48 to 53, a high signal is applied to the write enable terminal 41, and associated signals are applied to the RAS terminals 57 to 60 and the CAS terminal 54. Thus, the data stored in the designated address can be output from the data output terminal 55.

Electrode pads 25, 26 and 27 on the chip 20 in FIG. 4 correspond to the data input terminal DIN 40, WE terminal 41 and RAS terminals 57 to 60 in FIG. 6, respectively. Electrode pads 35, 36 and 37 on the chip 30 in FIG. 5 correspond to the data input terminal DIN 40, WE terminal 41 and RAS terminals 57 to 60 in FIG. 6, respectively.

The electrode pads 25 and 26 of the chip 20 as well as the electrode pads 35 and 36 of the chip 30 corresponding to the data input terminal DIN 40 and WE terminal 41 as the common connection pads of the memories are connected by means of wire to the associated leads 27 and 28 of the chip 20 as well as the associated leads 37 and 38 of the chip 30, respectively. These leads 27, 28, 37 and 38 are interconnected as stacked as shown in FIG. 1.

The connection of the RAS terminals which cannot be commonly connected, is carried out in the following manner.

RAS leads 24a to 24d are prepared for the chip 20, while RAS leads 34a to 34d are prepared for the chip 30. One of the RAS leads is connected to a RAS pad by means of wire. In FIGS. 4 and 5, a RAS pad 22 of the chip 20 is wired to the lead 24a and the leads 24b to 24d are not connected to any pads, i.e., electrically isolated. A RAS pad 32 of the chip 30 is connected to the lead 34b and the leads 34a, 34c and 34d are not connected to any pads, i.e., electrically isolated.

Similarly, the RAS pads of the third and fourth chips (not shown) are selectively connected to the leads which are mutually associated therewith. Under such a condition, when the interconnection shown in FIG. 1 is carried out, the RAS signal of the lowermost chip can be extracted on the lead 24a, the RAS signal of the chip located second from the bottom can be extracted on the lead 44c, the RAS signal of the chip located third from the bottom be extracted on the lead 44c, and the RAS signal of the chip located fourth from the bottom be extracted on the lead 54d, mutually independently, i.e., without mutual interference.

Thus, the RAS lead terminals corresponding in number to the number of stacked packages are provided to each package. In each chip, one of the RAS leads is selected and connected to an associated pad by means of wire so that the RAS signals can be prevented from being mutually interfered. On the mounting substrate 15, RAS signal wires are provided which correspond in number to the chips to be stacked.

Referring to FIGS. 7(a) through (d), the external leads are formed by sealing chips in resin to form packages, cutting off side and time bars and then bending each row of external leads along one sides of the packages with use of three metallic molds A, B and C.

Figure 7A:
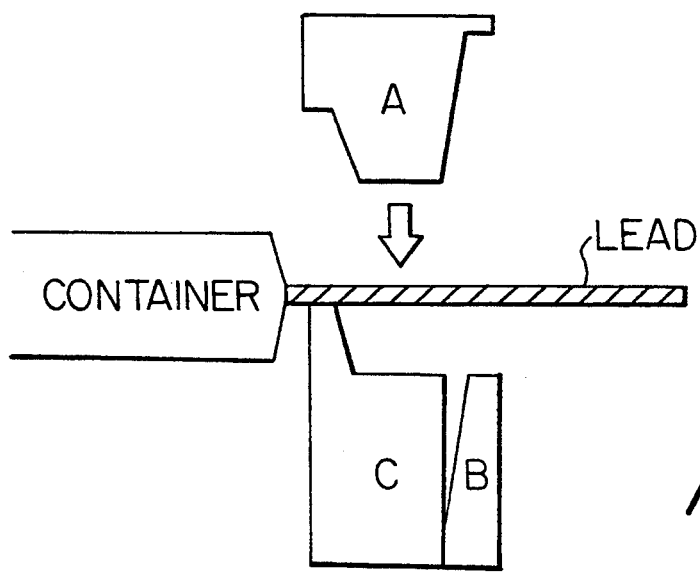
FIGS. 7(a) through (d) show the steps of forming the external lead in the first embodiment of the invention.
Figure 7B:
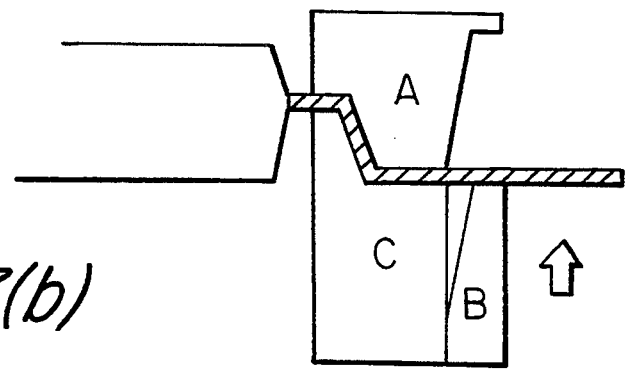
Figure 7C:
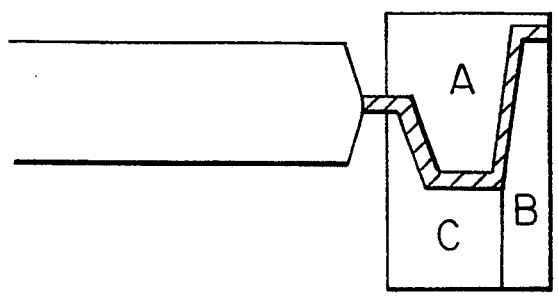
Figure 7D:
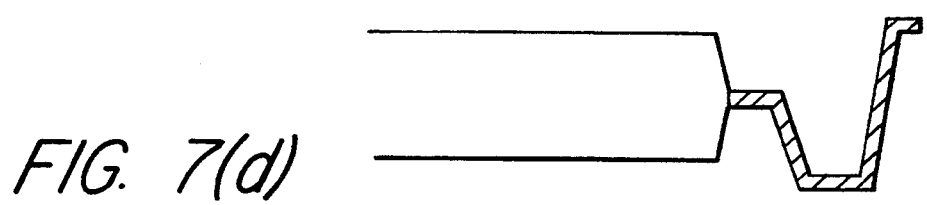

More particularly, the metallic mold jig A is moved downwardly as shown in FIG. 7(a) until each external lead 12 is bent toward the lower surface of a package. Then, the metallic mold jig B is moved upwardly as shown in FIG. 7(b) until each external lead 12 is bent back toward the upper surface of the package. FIG. 7(c) shows the completion of the bending operation to the external leads 12 and an external lead shown in FIG. 7(d) is obtained.

During the bending operation of the external leads, it is preferable to slightly bend the leads outwardly of the package surfaces to provide a stronger contacting force and to obtain a good surface contact with adjacent associated leads.

EMBODIMENT 2

Figure 8A:
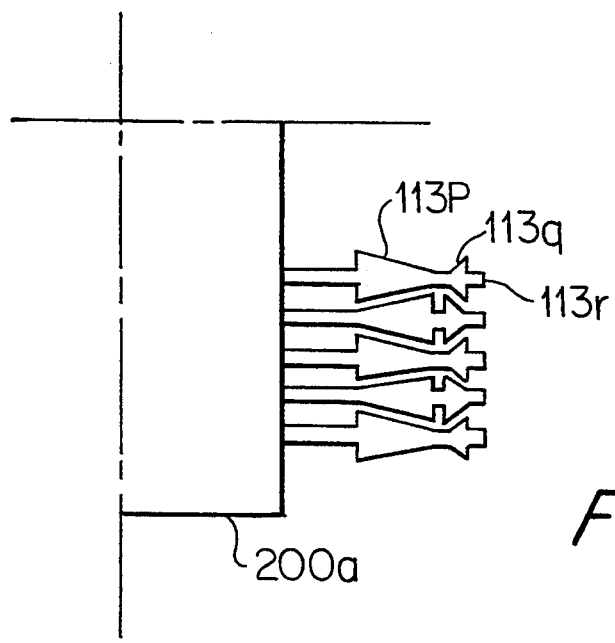
FIGS. 8(a) through (c) show the shape of the external lead in accordance with a second embodiment of the present invention.
Figure 8B:
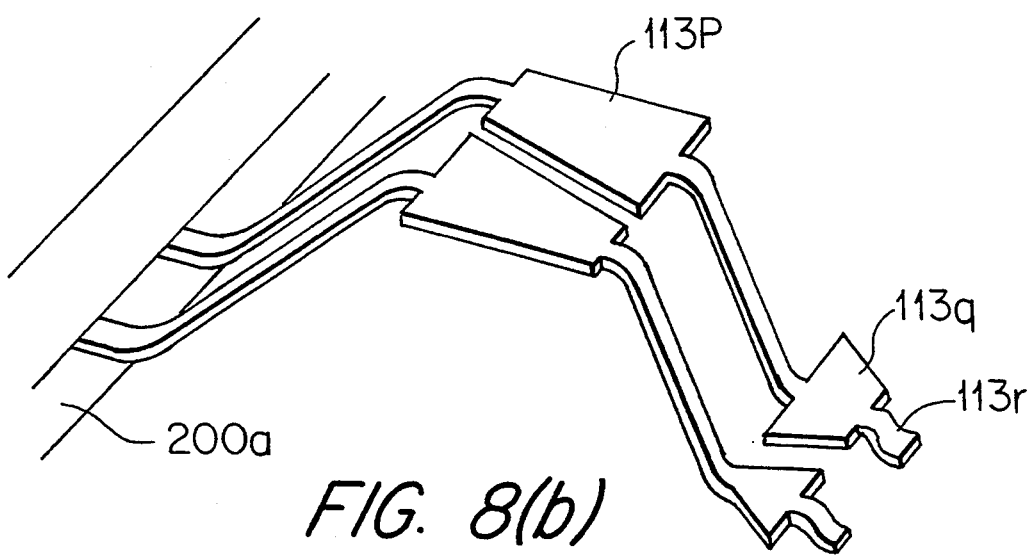

In Embodiment 1, the interconnection portion 13 is of a rectangular wide shape. In Embodiment 2, the interconnection portion has a complementary shape which allows high density as shown in FIGS. 8(a) and 8(b). More particularly, the interconnection portion has a generally triangular shape which is complementarily formed with the adjacent interconnection portions. With such a structure, a wide interconnection portion 113p positioned at the same level as the upper surface of the package and a wide interconnection portion 113q positioned at the same level as the lower surface of the package have a complementary shade with the adjacent parts. Thus, the contact area can be maximized.

Alternatively, in order to cope with high density wiring, a tip end 113r of the lead is narrowed and then bend for the interconnection with the wiring pattern 14.

Figure 8C:
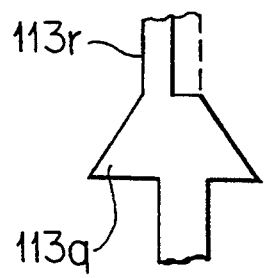

For example, the tip end 113r is formed as biased with respect to the wide interconnection portion 113q as shown in FIG. 8(c). With this structure, it is possible to avoid the mutual surface contact of the adjacent parts 113q in the lower surface plane of the package.

EMBODIMENT 3

Figure 9:
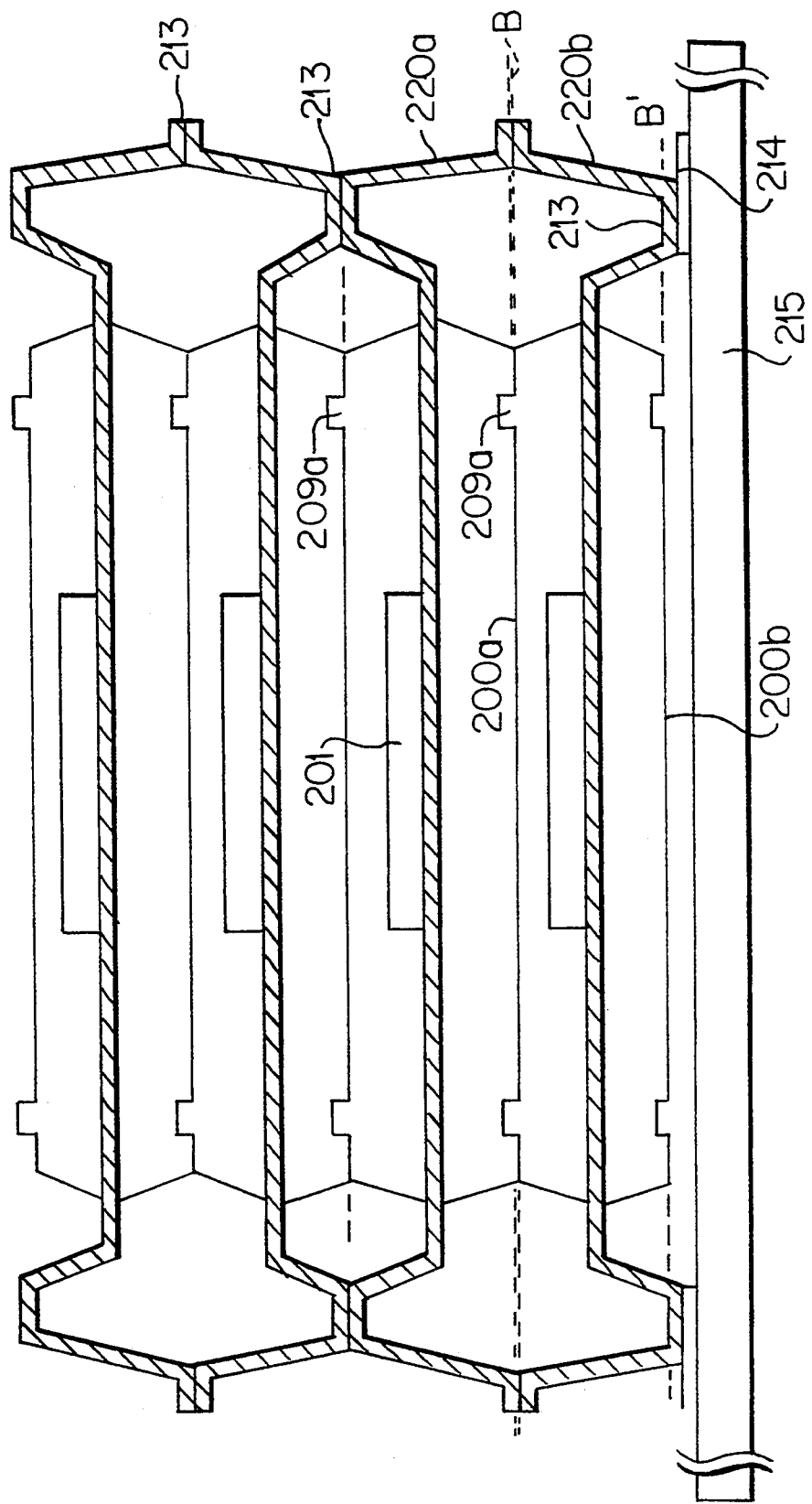
FIG. 9 is a cross-sectional view of a semiconductor assembly in accordance with a third embodiment of the present invention.

A semiconductor assembly of Embodiment 3 shown in FIG. 9 is same as the semiconductor assembly of the embodiment 1 except that there is provided heat radiating plates 220. Similarly to the external leads, these radiator plates are bent and interconnected, and then connected to a grounding wire 214 formed on a printed circuit board 215. Thus the heat radiating plates 220 serves both heat radiation and electrical grounding.

Incidentally, FIG. 9 is a cross-sectional view taken along a plane perpendicular to the sectional plane used in FIG. 1. If the same plane as in FIG. 1 is used, the cross-sectional view of the semiconductor assembly of the embodiment 3 is exactly the same as that of the embodiment 1.

As shown in FIG. 10, first and second heat radiating plates 220a and 220b are used also as die pads, and a semiconductor chip 201 is fixedly mounted on each of the radiator plates 220a and 220b.

In FIG. 10, reference numerals 200a and 200b denote first and second containers respectively. Same as in the embodiment 1, the first container 200a is stacked on the second container 200b, first and second external leads 212a and 212b guided from the insides of the respective containers 200a and 200b are bent as extended to the bottom and top surface levels of the first and second containers and then connected with each other in surface contact relationship to form a pair of interconnection portions 213 which is connected to a wiring pattern formed on the printed circuit board 215.

The first and second containers are provided at their corresponding positions with a recess 209a and a projection 209b for positional alignment which can fit into associated projection and recess.

The same description can be made for third and fourth semiconductor devices. Therefore, the description for third and fourth semiconductor devices are omitted.

The heat radiating plates are bent and shaped in substantially the same manner as in the embodiment 1 with use of the aforementioned metallic molds.

With such a semiconductor assembly, in addition to the aforementioned effects of the embodiment 1, excellent heat radiation can be realized. Therefore, this embodiment is suitable for a semiconductor chip having a large heat dissipation.

Although the external leads are bent and connected in substantially the same manner as the heat radiator plates in the foregoing embodiments, only the radiator plates may be bent and mutually connected while the external leads may be formed to have respectively an ordinary independent shape.

In the foregoing embodiments, the interconnection portions of the external leads are connected each other at the level where the first and second containers are contacted with each other. However, the present invention is not limited to such construction. The interconnection portions may be connected to each other at any level. The external leads are preferable bent in the same manner regardless of the level of the interconnection portions.

What is claimed

1. A semiconductor assembly comprising:
   a first semiconductor device having a first container for containing a semiconductor chip and a first external lead extending from inside of said first container to outside thereof; and
   a second semiconductor device having a second container for containing another semiconductor chip and a second external lead extending from inside of said second container to outside thereof,
   wherein said first and second containers are stacked one over another, and wherein said first and second external leads extend outward to respective upward and downward bent portions joining with first flat interconnection portions further extending outward to respective downward and upward bent portions joining with second flat interconnection portions, one of said interconnection portions being disposed over an upper surface level of an associated container, another of said interconnection portions being disposed below a lower surface level of said associated container so that at least one of said first and second flat interconnection portions on said first external lead and a corresponding one of the first and second flat interconnection portions on the second external lead are maintained in mutual contact.

2. A semiconductor assembly as set forth in claim 1, wherein each of said interconnection portions has a rectangular shape and a width larger than other portions of the external lead.

3. A semiconductor assembly as set forth in claim 1, wherein each of said interconnection portions has a triangular shape which is so arranged so as to form a mutually complementary shape with a corresponding interconnection portion of an adjacent external lead.

4. A semiconductor assembly as set forth in any of claims 1 to 3, wherein at least one of said first and second leads extends outwardly to a tip defining a narrow projection bent so as to be connected to a wiring pattern formed on a semiconductor device mounting pattern.

5. A semiconductor assembly as set forth in claim 1 one of said first and second interconnection portions is a flat part which is disposed at an upper surface level of an associated container, and the other of said first and second interconnection portions is a flat part which is disposed at a lower surface level of said associated container.

6. A semiconductor assembly as set forth in either of claims 1 or 5 wherein said first and second containers are provided at their corresponding positions with a recess and a projection to be mutually engaged for positional alignment.

7. A semiconductor assembly comprising:
a first semiconductor device having a first container for containing a semiconductor chip and a first external lead extending from the inside of said first container and a first heat radiating plate thermally contacted with said semiconductor chip and extending from the inside of said container; and
a second semiconductor device having a second container for containing another semiconductor chip and a second external lead extending from the inside of said second container and second heat radiating plate thermally contacted with said semiconductor chip and extending from the inside of said container,
wherein said first and second containers are stacked one over another, and wherein said first and second heat radiating plates each extend outward to respective upward and downward bent portions joining with first flat interconnection portions further extending outward to respective downward and upward bent portions joining with second flat interconnection portions, at least one of said first and second flat interconnection portions defining a thermal contact portion on one of said heat radiating plates to be contacted by a corresponding thermal contact portion on the other of said heat radiating plates.

8. A semiconductor assembly as set forth in claim 7, wherein said first and second heat radiating plates are provided respectively with first and second thermal contact portions, said first thermal contact portion is a flat part which is disposed in upper surface level of said container, and said second thermal contact part is a flat part which is disposed in lower surface level of said container.

9. A semiconductor assembly comprising:
a first semiconductor device having a first container for containing a semiconductor chip and a first external lead extending from inside of said first container and a first heat radiating plate thermally contacted with said semiconductor chip and extending from the inside of said first container; and
a second semiconductor device having a second container for containing another semiconductor chip and a second external lead extending from inside of said second container and a second heat radiating plate thermally contacted with said semiconductor chip and extending from the inside of said second container;
wherein said first and second containers are stacked one over another, said first and second heat radiating plates have a thermal contact portion and are bent so as to be contacted with each other at said thermal contact portion, and wherein said heat radiating plates are electrically connected to a grounding wire formed on a semiconductor device mounting board.

10. A semiconductor assembly comprising:
a first semiconductor device having a first container for containing a semiconductor chip and a first external lead extending from inside of said first container and a first heat radiating plate thermally contacted with said semiconductor chip and extending from the inside of said first container; and
a second semiconductor device having a second container for containing another semiconductor chip and a second external lead extending from inside of said second container and a second heat radiating plate thermally contacted with said semiconductor chip and extending from the inside of said second container;
said first and second containers being stacked one over another, said first and second heat radiating plates having a thermal contact portion and being bent so as to be contacted with each other at said thermal contact portion, and said external leads having interconnection portions and being bent so as to be contacted with each other at said interconnection portions.

11. A semiconductor assembly as set forth in claim 1, wherein said interconnection portions of the first and second external leads contact with each other at the level where said first and second containers contact with each other.

12. A semiconductor assembly as set forth in claim 5, wherein said interconnection portions each has a rectangular shape and a width larger than other portions of the external lead.

13. A semiconductor assembly as set forth in claim 5, wherein said interconnection portions each has a triangular shape which is so arranged as to form a mutually complementary shape with an interconnection portion of an adjacent external lead.

* * * * *